(12) United States Patent
Shin et al.

(10) Patent No.: US 11,403,894 B2
(45) Date of Patent: Aug. 2, 2022

(54) FAULT DIAGNOSIS APPARATUS AND METHOD OF RAPID CHARGING SYSTEM FOR VEHICLE

(71) Applicants: HYUNDAI MOTOR COMPANY, Seoul (KR); KIA MOTORS CORPORATION, Seoul (KR)

(72) Inventors: Ho Joon Shin, Suwon-si (KR); Nam Koo Han, Yongin-si (KR); Sang Yoo Lee, Seoul (KR); Heon Young Kwak, Hwaseong-si (KR); Hong Geuk Park, Cheonan-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 694 days.

(21) Appl. No.: 16/390,827

(22) Filed: Apr. 22, 2019

(65) Prior Publication Data
US 2020/0184746 A1 Jun. 11, 2020

(30) Foreign Application Priority Data
Dec. 11, 2018 (KR) .......................... 10-2018-0158962

(51) Int. Cl.
*G07C 5/08* (2006.01)
*B60L 50/51* (2019.01)
(Continued)

(52) U.S. Cl.
CPC ............ *G07C 5/0808* (2013.01); *B60L 50/51* (2019.02); *B60L 50/60* (2019.02); *B60L 53/11* (2019.02);
(Continued)

(58) Field of Classification Search
CPC ......... G07C 5/0808; G07C 3/00; B60L 50/51; B60L 50/60; B60L 53/11; B60L 58/10;
(Continued)

(56) References Cited

U.S. PATENT DOCUMENTS

2002/0070608 A1* 6/2002 Matsuki ................. B23K 31/02
307/9.1
2015/0321574 A1* 11/2015 Oi ............................ B60L 3/04
307/10.1

(Continued)

FOREIGN PATENT DOCUMENTS

JP 2009-0296844 A 12/2009
JP 5780111 B2 9/2015

*Primary Examiner* — Paul Dinh
(74) *Attorney, Agent, or Firm* — McDonnell Boehnen Hulbert & Berghoff LLP (57) ABSTRACT

Disclosed herein is a fault diagnosis apparatus of a rapid charging system for a vehicle including an external device configured to exchange power with a vehicle battery, a power transfer unit including a three-phase motor, an inverter connected to the battery in parallel and connected to the three-phase motor, and one or more relays connected to the three-phase motor and configured to transfer power between the external device and the battery, and a controller configured to control the on and off functions of the relay, to control driving of the inverter to generate voltages applied to one end of each of the relays, and to diagnose fault of relays by comparing voltages of both ends of the relays while turning the relays on/off.

18 Claims, 7 Drawing Sheets

(51) Int. Cl.
  *B60L 50/60* (2019.01)
  *B60L 58/10* (2019.01)
  *B60L 53/10* (2019.01)
  *G07C 3/00* (2006.01)
  *G01R 31/327* (2006.01)
  *B60L 53/60* (2019.01)

(52) U.S. Cl.
  CPC .......... *B60L 58/10* (2019.02); *G01R 31/3278* (2013.01); *G07C 3/00* (2013.01); *B60L 53/60* (2019.02); *B60L 2210/40* (2013.01)

(58) Field of Classification Search
  CPC ................ B60L 53/60; B60L 2210/40; B60L 2240/427; B60L 2240/527; B60L 3/0023; B60L 53/10; B60L 53/20; B60L 3/0061; B60L 50/53; B60L 2220/58; B60L 2240/547; G01R 31/3278; Y02T 10/64; Y02T 10/70; Y02T 10/7072; Y02T 90/14; B60Y 2200/91; B60Y 2306/15
  USPC ...................................................... 320/109
  See application file for complete search history.

(56) References Cited

U.S. PATENT DOCUMENTS

2016/0156258 A1* 6/2016 Yokoyama ............ B60L 3/0023
    307/82
2018/0238935 A1* 8/2018 Nakashima .......... G01R 19/003

* cited by examiner

FAULT DIAGNOSIS APPARATUS AND METHOD OF RAPID CHARGING SYSTEM FOR VEHICLE

CROSS REFERENCE TO RELATED APPLICATION

This application claims priority to Korean Patent Application No. 10-2018-0158962, filed on Dec. 11, 2018 in the Korean Intellectual Property Office, the disclosure of which is incorporated herein by reference.

TECHNICAL FIELD

The present disclosure relates to a fault diagnosis apparatus and method of a rapid charging system for a vehicle.

BACKGROUND

Ecofriendly vehicles such as electric vehicles (EVs) or plug-in hybrid electric vehicles (PHEVs) use electric vehicle supply equipment (EVSE) installed in a charging station for battery charging.

Figure 1:
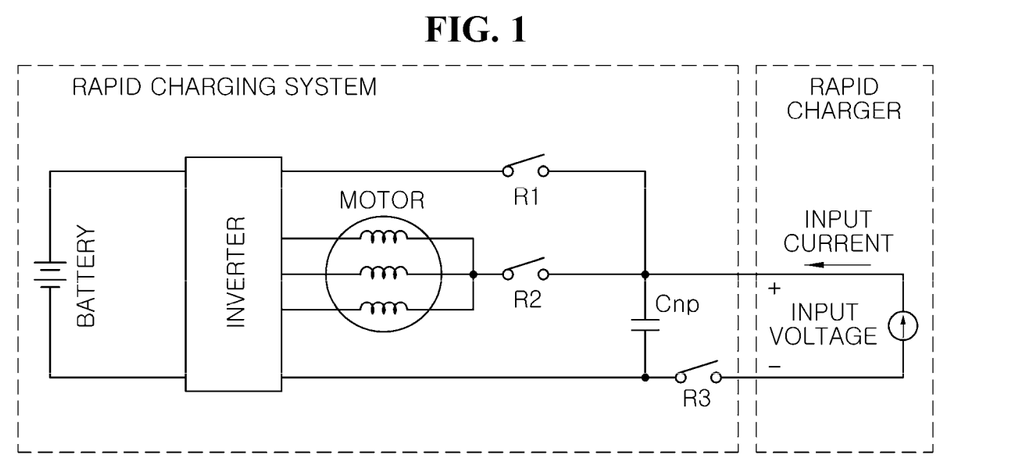
FIG. 1 is a diagram showing the configuration of a rapid charging system for a vehicle.

As shown in FIG. 1, in a general rapid charging system for a vehicle using a motor-inverter, a plurality of switches is used. Fault diagnosis of such switches is very important in terms of stable driving of the entire system and is also very important in terms of a fail-safe system. However, in conventional vehicle charging equipment, since a separate voltage sensor is not provided on a neutral terminal of a motor, it was not possible to diagnose fault of a switch R2 located on the neutral terminal of the motor. Instead, for fault diagnosis, a separate voltage sensor may be provided on the neutral terminal of the motor. However, when such a voltage sensor is added, manufacturing costs may increase.

The matters disclosed in this section are merely for enhancement of understanding of the general background of the technology and should not be taken as an acknowledgment or suggestion that the matters form the related art already known to a person skilled in the art.

SUMMARY

The present disclosure provides a fault diagnosis apparatus and method of a rapid charging system for a vehicle, which is capable of easily diagnosing fault of relays in a power transfer unit without adding a separate voltage sensor.

In accordance with an aspect of the present disclosure, the above and other objects may be accomplished by a fault diagnosis apparatus of a rapid charging system for a vehicle including an external device configured to exchange power with a vehicle battery, a power transfer unit including a three-phase motor, an inverter connected to the battery in parallel and connected to the three-phase motor, and one or more relays connected to the three-phase motor and configured to transfer power between the external device and the battery and a controller configured to control the on and off functions of the relays, to control driving of the inverter to generate voltages applied to one end of each of the relays, and to diagnose fault of the relays by comparing voltages of both ends of the relays while turning the relays on/off.

The power transfer unit may include a neutral-terminal capacitor connected to a neutral terminal of the three-phase motor in parallel, a second relay connected to a neutral terminal of the three-phase motor, and first and third relays connected to the inverter.

The controller may execute instructions to turn on or off the first relay, the second relay and the third relay.

The controller may control driving of the inverter to generate the voltage applied to one end of the second relay.

The voltage applied to one end of the second relay may be generated by driving the inverter based on the following equation:

$$Vn = (1-Dx) \times Vbat$$

where, Vn denotes the voltage applied to one end of the second relay, Vbat denotes a voltage of the battery, and Dx denotes a ratio of a time when an upper switch between the upper and lower switches connected to each phase of the three-phase motor is turned on.

The controller may generate the voltage applied to one end of the second relay, which is different from a voltage of the battery and a voltage value received from the external device.

The controller may generate the voltage applied to one end of the second relay, which is less than a voltage value received from the external device.

The controller may diagnose the first relay, the second relay and the third relay by comparing the voltages of both ends of the first relay, the second relay and the third relay while the first relay, the second relay and the third relay are turned on/off.

The controller may determine that the first relay, the second relay and the third relay are short-circuited when the voltages of both ends of the first relay, the second relay and the third relay are the same in a state in which the first relay, the second relay and the third relay are turned off.

The controller may turn on the second relay before the power transfer unit is connected to the external device and control driving of the inverter to generate the voltage applied to one end of the second relay, which is equal to the voltage value received from the external device.

Upon determining that the first relay, the second relay and the third relay are not short-circuited, the controller may turn on the second relay, control driving of the inverter to generate the voltage applied to one end of the second relay, which is equal to the voltage value received from the external device, and determine whether the second relay is open-circuited by comparing the voltages of both ends of the second relay.

The controller may turn on the third relay to charge the vehicle battery, upon determining that the second relay is not open-circuited.

The power transfer unit may include one or more motor relays connected to one or more of the phases of the three-phase motor, an inductor connected to the motor relays in series, and an inverter relay connected to the inverter.

The controller may control on/off of the motor relays, control driving of the inverter to generate voltages applied to one end of each of the motor relays, and diagnose fault of the motor relays by comparing voltages of both ends of the motor relays while turning the motor relays on/off.

The controller may diagnose fault of the inverter relay by comparing voltages of both ends of the inverter relay while turning the inverter relay on/off.

In accordance with another aspect of the present disclosure, the above and other objects may be accomplished by a fault diagnosis method of a rapid charging system for a vehicle including controlling driving of the inverter to generate a voltage applied to one end of a second relay and diagnosing fault of a first relay, the second relay and a third relay by comparing voltages of both ends of the first relay, the second relay and the third relay measured in a state in which the first relay, the second relay and the third relay are turned off.

The voltage applied to one end of the second relay may be generated by driving the inverter based on the following equation:

$$Vn=(1-Dx)\times Vbat$$

where, Vn denotes the voltage applied to one end of the second relay, Vbat denotes a voltage of the battery, and Dx denotes a ratio of a time when an upper switch between the upper and lower switches connected to each phase of the three-phase motor is turned on.

The diagnosing of the first relay, the second relay and the third relay may include determining that the first relay, the second relay and the third relay are short-circuited when the voltages of both ends of the first relay, the second relay and the third relay are the same in a state in which the first relay, the second relay and the third relay are turned off.

The fault diagnosis method may further include turning on the second relay before the power transfer unit is connected to the external device and controlling driving of the inverter to generate the voltage applied to one end of the second relay, which is equal to a voltage value received from the external device.

The fault diagnosis method may further include turning on the second relay, controlling driving of the inverter to generate the voltage applied to one end of the second relay, which is equal to a voltage value received from the external device, and determining whether the second relay is open-circuited by comparing the voltage of both ends of the second relay, upon determining that the first relay, the second relay and the third relay are not short-circuited.

BRIEF DESCRIPTION OF THE FIGURES

The above and other objects, features and other advantages of the present disclosure will be more clearly understood from the following detailed description taken in conjunction with the accompanying drawings, in which.

DETAILED DESCRIPTION

Hereinafter, a fault diagnosis apparatus of a rapid charging system for a vehicle will be described with reference to the accompanying drawings.

Figure 2:
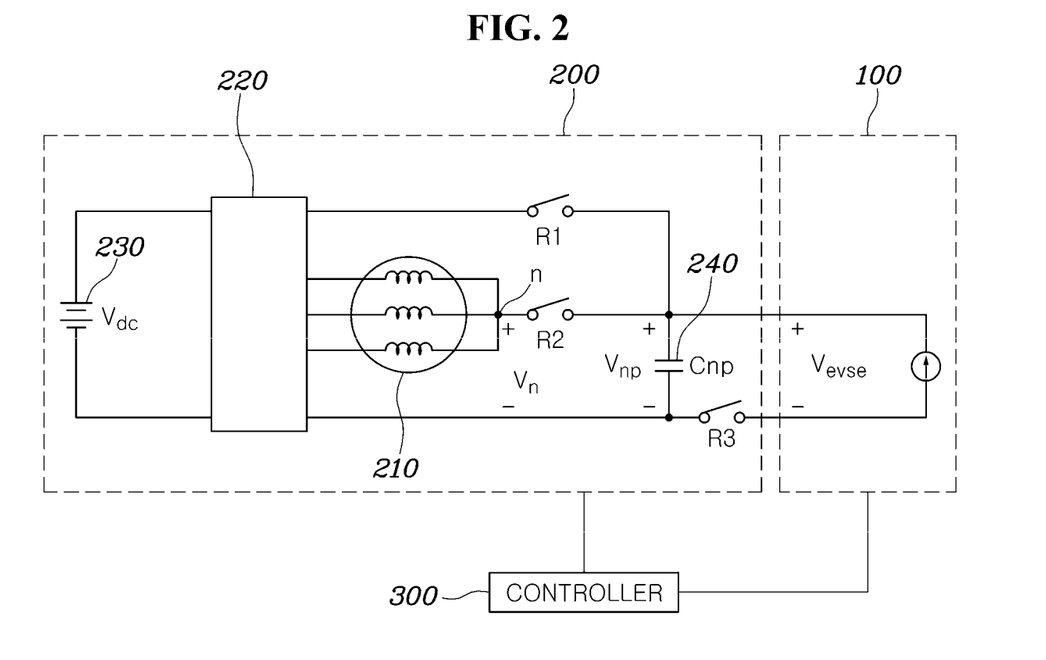
FIG. 2 is a diagram showing the configuration of a fault diagnosis apparatus of a rapid charging system for a vehicle according to an embodiment.

FIG. 2 is a diagram showing the configuration of a fault diagnosis apparatus of a rapid charging system for a vehicle according to an embodiment of the present disclosure. As shown in FIG. 2, the fault diagnosis apparatus of the rapid charging system for the vehicle according to the embodiment of the present disclosure may include an external device 100, a power transfer unit 200 and a controller 300.

The external device 100 serves to exchange power with a vehicle battery. In an embodiment, the external device 100 may be electric vehicle supply equipment (EVSE) of a charging station for charging the vehicle battery. In another embodiment, the external device 100 may be another device for receiving power from the vehicle battery.

The power transfer unit 200 serves to transfer power between the external device 100 and a battery. In some embodiments, the power transfer unit 200 may receive power from the external device 100 to charge the vehicle battery. Specifically, as shown in FIG. 2, the power transfer unit 200 may include a three-phase motor 210, an inverter 220 connected to a battery 230 in parallel and connected to the three-phase motor 210, and one or more relays connected to the three-phase motor 210. Here, the inverter 220 may receive a three-phase signal from the three-phase motor 210 through a plurality of drivers S1 to S6 connected to one another in the inverter 220. At this time, the three-phase signal may include an input voltage and input current input to each phase of the three-phase motor 210. In addition, power received from the battery 230 through the plurality of drivers S1 to S6 connected to one another in the inverter 220 may be provided to each phase of the three-phase motor 210.

Specifically, the power transfer unit 200 may include a neutral-terminal capacitor 240 Cnp connected to a neutral terminal (node n) of the three-phase motor 210, a second relay R2 connected to the neutral terminal of the three-phase motor, and a first relay R1 and a third relay R3 connected to the inverter 220, as shown in FIG. 2.

The controller 300 may control on/off of the relays included in the power transfer unit 200, control driving of the inverter 200 to generate voltages applied to one end of each of the relays, and compare voltages of both ends of the relays while turning the relays on/off, thereby diagnosing fault of relays.

In general, relay fault diagnosis may be performed by checking the voltages of both ends of the relays when the relays are turned on/off. For example, when the voltages of both ends of the relays are the same in a state in which the relays are turned off, it may be diagnosed that the relays are short-circuited. In addition, when the voltages of both ends of the relays are different in a state in which the relays are turned on, it may be diagnosed that the relays are open-circuited. By the above method, in the present disclosure, the controller 300 may compare the voltages of both ends of the relays while the relays are turned on/off, thereby diagnosing fault of relays.

Specifically, referring to FIG. 2, the controller 300 may execute instructions to control the on and off functions of the first relay R1, the second relay R2 and the third relay R3. In addition, the controller 300 may control driving of the inverter 200 to generate a voltage applied to one end of the second relay R2. Here, controlling driving of the inverter 200 may mean that the on/off of the plurality of drivers S1 to S6 included in the inverter 200 is controlled. That is, the controller 300 may execute instructions to control the on and off functions of the plurality of drivers S1 to S6 in the inverter 200, thereby generating the voltage applied to one end of the second relay R2.

In the present disclosure, the voltage applied to one end of the second relay R2 is generated, in order to compare the voltage applied to one end of the second relay R2 with the voltage of the other end of the second relay R2 to diagnose fault of the second relay R2. In a conventional rapid charging system, since a separate voltage sensor is not provided on the neutral terminal of the three-phase motor 210, it is impossible to diagnose fault of the second relay R2. As described in the embodiments above, the controller 300 generates and applies the voltage to one end of the second relay R2 and compares the voltages of both ends of the second relay R2, thereby easily diagnosing fault of the second relay R2 without additionally providing a voltage sensor.

Figure 3:
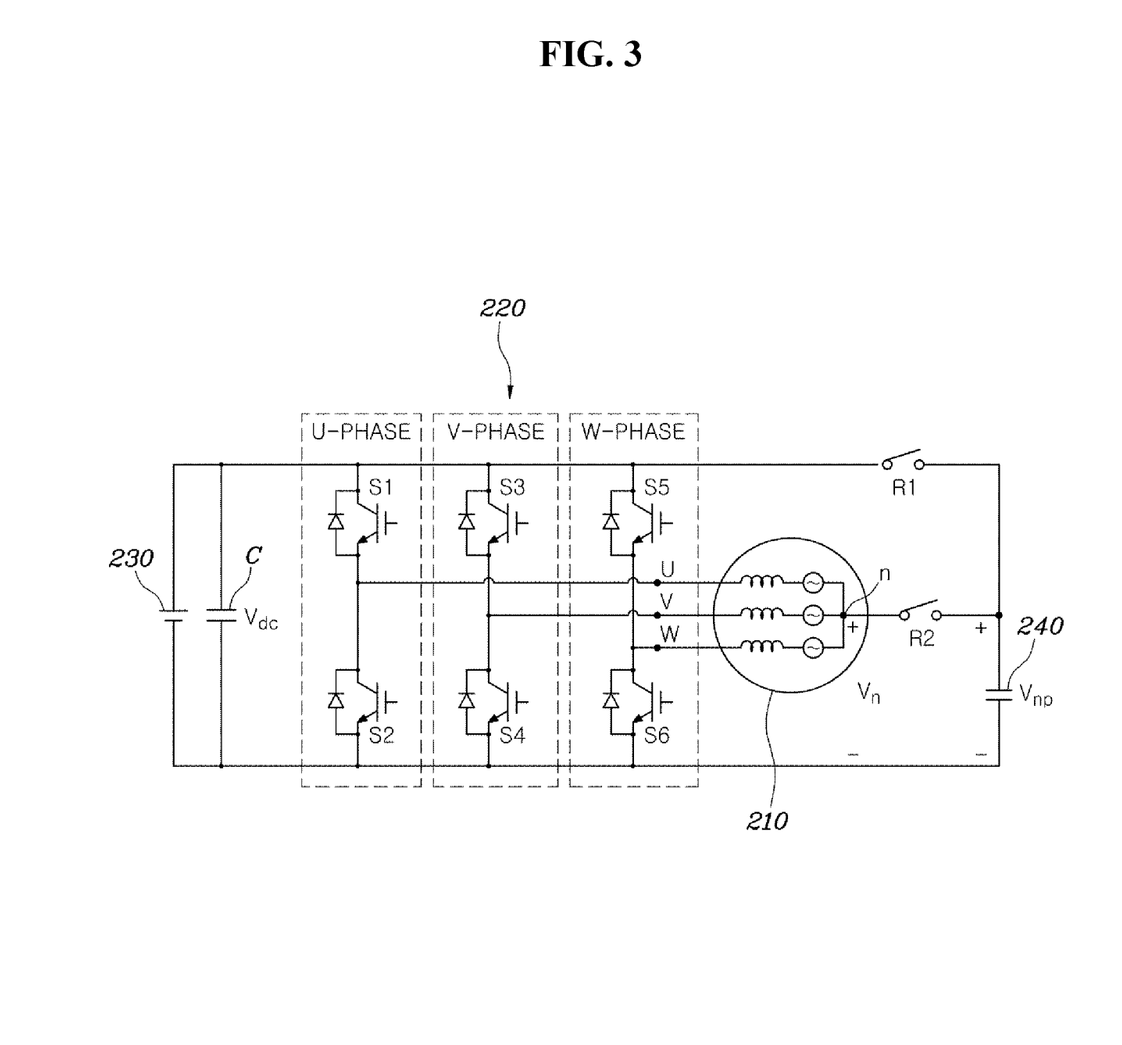
FIG. 3 is a diagram showing a connection relationship between an inverter and a three-phase motor in a fault diagnosis apparatus of a rapid charging system for a vehicle according to an embodiment of the present disclosure.

More specifically, the voltage generated by the controller 300 and applied to one end of the second relay R2 may be generated through driving of the inverter 200 based on the following equation.

$$Vn = (1 - Dx) \times Vbat \quad \text{Equation 1}$$

where, Vn denotes the voltage applied to one end of the second relay, Vbat denotes the voltage of the battery, and Dx denotes a ratio of a time when an upper switch between the upper and lower switches connected to each phase of the three-phase motor is turned on. More specifically, referring to FIG. 3, Dx means the ratio (0 to 1) of the time when the upper switch S1, S3 or S5 connected to the U-phase, V-phase or W-phase of the three-phase motor is turned on. In addition, in the present embodiment, the times Du, Dv and Dw when the upper switches S1, S3 and S5 connected to the phases U, V and W of the three-phase motor are turned on are preferably set to the same value, in order to prevent the three-phase motor 210 from rotating when the voltage applied to the second relay R2 is generated by setting Du, Dv and Dw to different values.

Meanwhile, the controller 300 may generate the voltage Vn applied to one end of the second relay R2, which is different from the voltage Vbat of the battery and the voltage Vevse received from the external device 100. At this time, the voltage Vn applied to one end of the second relay R2 is different from the voltage Vbat of the battery and the voltage Vevse received from the external device 100, in order to simultaneously diagnose fault of the first relay R1, the second relay R2 and the third relay R3.

Specifically, the controller 300 may generate the voltage Vn applied to one end of the second relay R2, which is less than the voltage Vevse received from the external device 100. Here, when the controller 300 generates the voltage Vn applied to one end of the second relay R2, which is less than the voltage Vevse received from the external device 100, it is possible to prevent the external device 100 from being damaged. In some embodiments, the voltage Vn applied to one end of the second relay R2 may be half the voltage Vevse received from the external device 100.

Hereinafter, diagnosis of fault of the relays R1, R2 and R3 in the power transfer unit 200 by the controller 200 will be described.

The controller 300 may compare the voltages of both ends of the first relay R1, the second relay R2 and the third relay R3 while turning on/off the first relay R1, the second relay R2 and the third relay R3, thereby diagnosing fault of the first relay R1, the second relay R2 and the third relay R3. Specifically, the controller 300 may determine that the first relay R1, the second relay R2 and the third relay R3 are short-circuited if the voltages of the first relay R1, the second relay R2 and the third relay R3 are the same, when a predetermined time has elapsed after the voltage generated according to the above-described method is applied to the second relay R2 in a state in which the first relay R1, the second relay R2 and the third relay R3 are turned off. More specifically, referring to FIG. 2, the controller 300 may determine that the first relay R1 is short-circuited if Vbat and Vnp are the same, determine that the second relay R2 is short-circuited if Vn and Vnp are the same, and determine that the third relay R3 is short-circuited if Vnp and Vevse are the same, when the predetermined time has elapsed after the voltage generated according to the above-described method is applied to the second relay in a state in which the first relay R1, the second relay R2 and the third relay R3 are turned off.

According to the present disclosure, since fault of the relays in the power transfer unit 200 is diagnosed without additionally installing a voltage sensor, it is possible to reduce manufacturing costs. In addition, since the relays are simultaneously diagnosed, it is possible to shorten the fault diagnosis time of the relays.

Meanwhile, the controller 300 may turn on the second relay R2 before the power transfer unit 200 is connected to the external device 100 and control driving of the inverter 200 to generate the voltage Vn applied to one end of the second relay R2, which is equal to the voltage Vevse received from the external device 100. At this time, the voltage Vn applied to one end of the second relay R2 is equal to the voltage Vevse received from the external device 100, in order to prevent charging current from rapidly flowing into the neutral-terminal capacitor Cnp when charging starts by turning on the third relay R3 and connecting the power transfer unit 200 to the external device 100.

In addition, upon determining that the first relay R1, the second relay R2 and the third relay R3 are not short-circuited, the controller 300 may turn on the second relay R2, control driving of the inverter 200 to generate and apply the voltage Vn applied to one end of the second relay R2, which is equal to the voltage Vevse received from the external device 100, to the second relay R2, and determine whether the second relay R2 is open-circuited by comparing the voltages of both ends of the second relay R2. Upon determining that the second relay R2 is not open-circuited, the controller 300 may turn on the third relay R3 to charge the vehicle battery 230.

Figure 4:
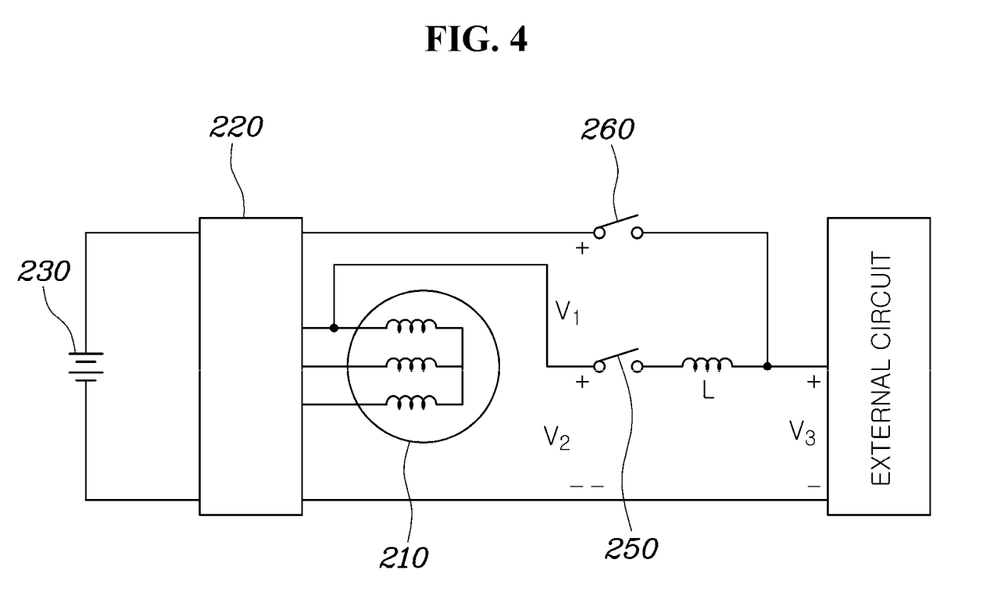
FIG. 4 is a diagram showing the configuration of a power transfer unit in a fault diagnosis apparatus of a rapid charging system for a vehicle according to another embodiment of the present disclosure.
Figure 5:
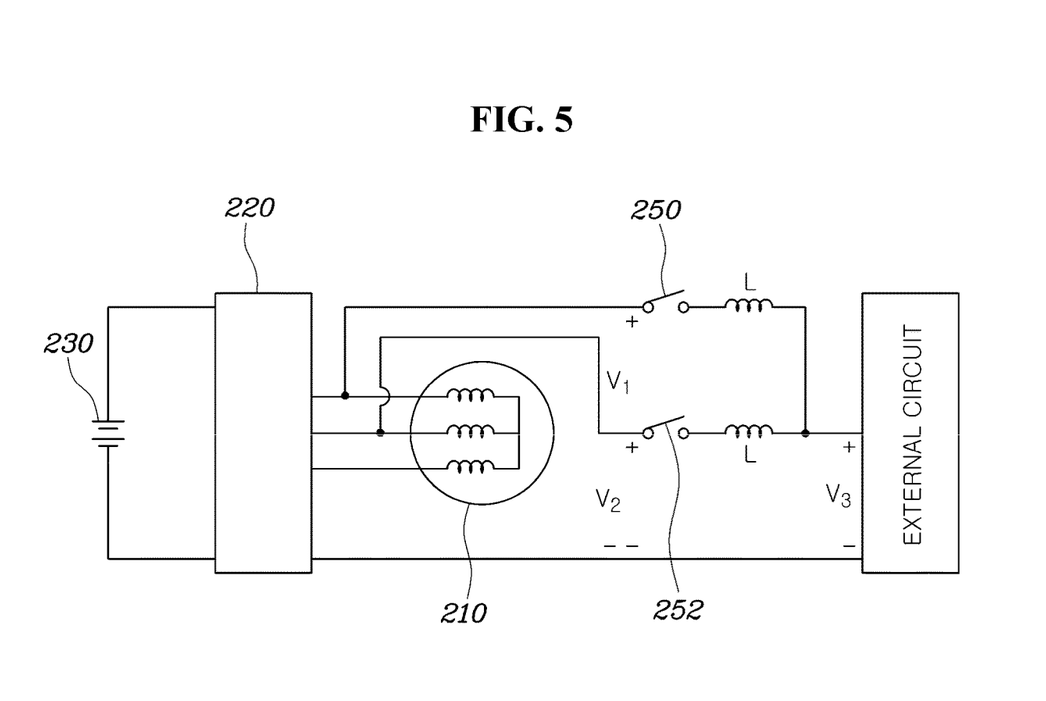
FIG. 5 is a diagram showing the configuration of a power transfer unit in a fault diagnosis apparatus of a rapid charging system for a vehicle according to another embodiment of the present disclosure.
Figure 6:
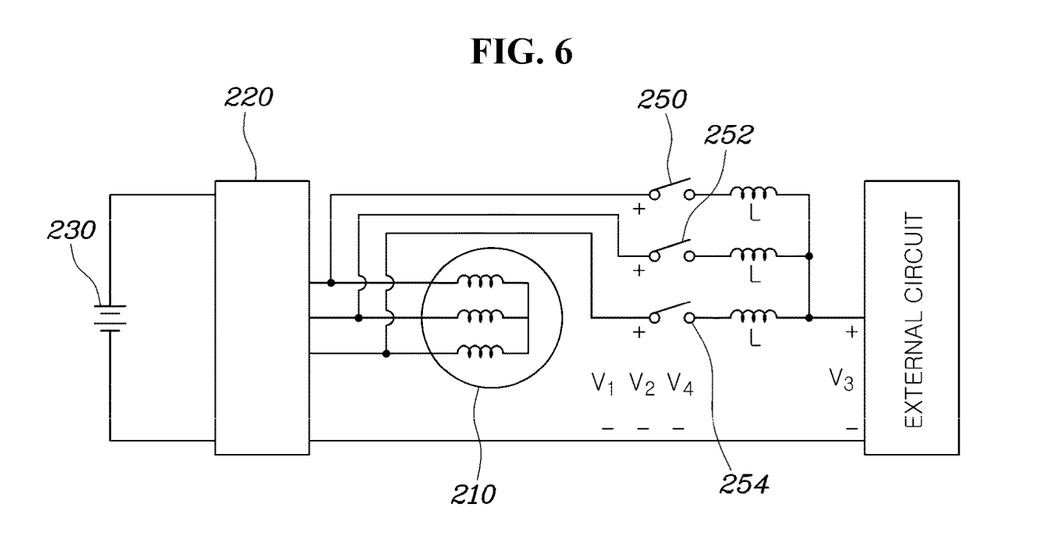
FIG. 6 is a diagram showing the configuration of a power transfer unit in a fault diagnosis apparatus of a rapid charging system for a vehicle according to another embodiment of the present disclosure.

Meanwhile, referring to FIGS. 4 to 6, the power transfer unit 200 of the fault diagnosis apparatus of the rapid charging system for the vehicle according to another embodiment may include one or more motor relays 250, 252 and 254 connected to one or more of the phases of a three-phase motor 210, an inductor L connected to the motor relays 250, 252 and 254 and an inverter relay 260. In as the embodiment shown in FIG. 4, the motor relay 250 may be connected to only one phase of the three-phase motor 210. In another embodiment, as shown in FIG. 5, the motor relays 250 and 252 may be connected to two phases of the three-phase motor 210. In yet another embodiment, as shown in FIG. 6, the motor relays 250, 252 and 254 may be respectively connected to the three phases of the three-phase motor 210.

In addition, the controller 300 may execute instructions to control the on and off functions of the motor relays 250, 252 and 254, control driving of the inverter 200 to generate the voltages applied to one end of each of the motor relays 250, 252 and 254, and compare the voltages of both ends of the motor relays 250, 252 and 254 while turning on/off the motor relays 250, 252 and 254 to diagnose fault of the motor relays 250, 252 and 254.

Further, by comparing the voltages of both ends of the inverter relay 260 while turning the inverter relay 260 on/off, it is possible to diagnose fault of the inverter relay 260.

Figure 7:
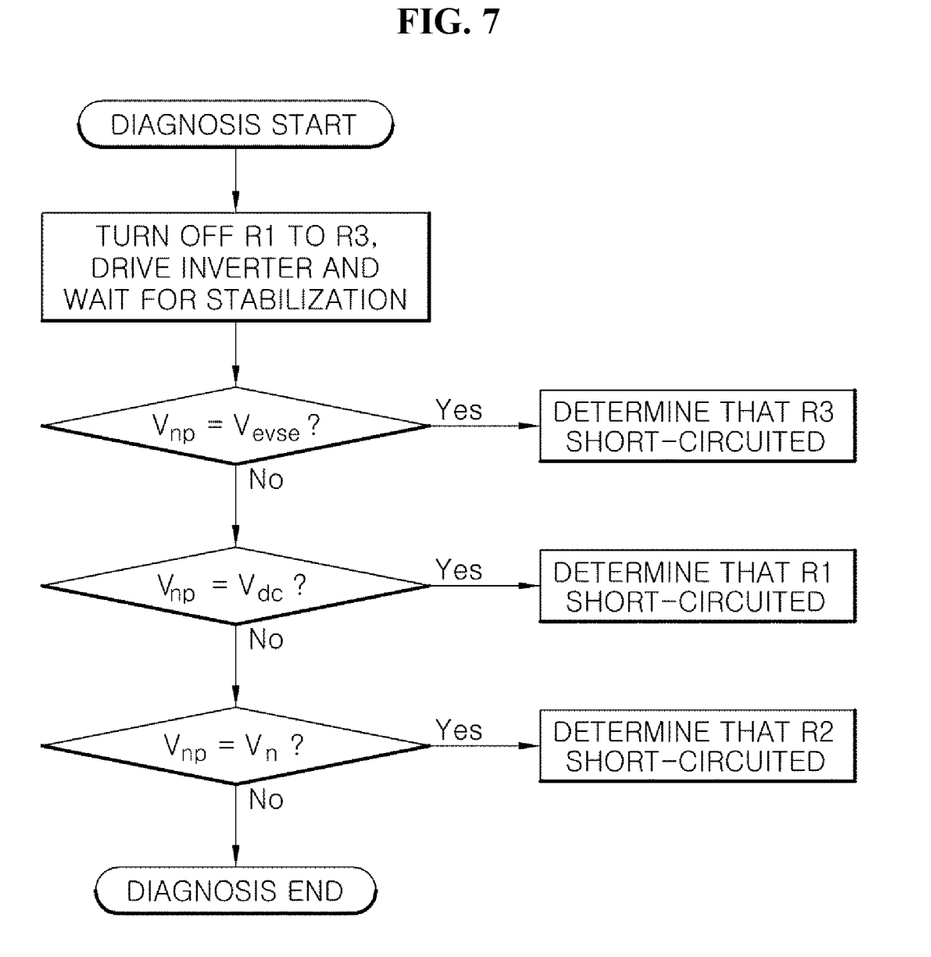
FIG. 7 is a flowchart illustrating diagnosis of short-circuit of a relay in a fault diagnosis apparatus of a rapid charging system for a vehicle according to another embodiment of the present disclosure.
Figure 8:
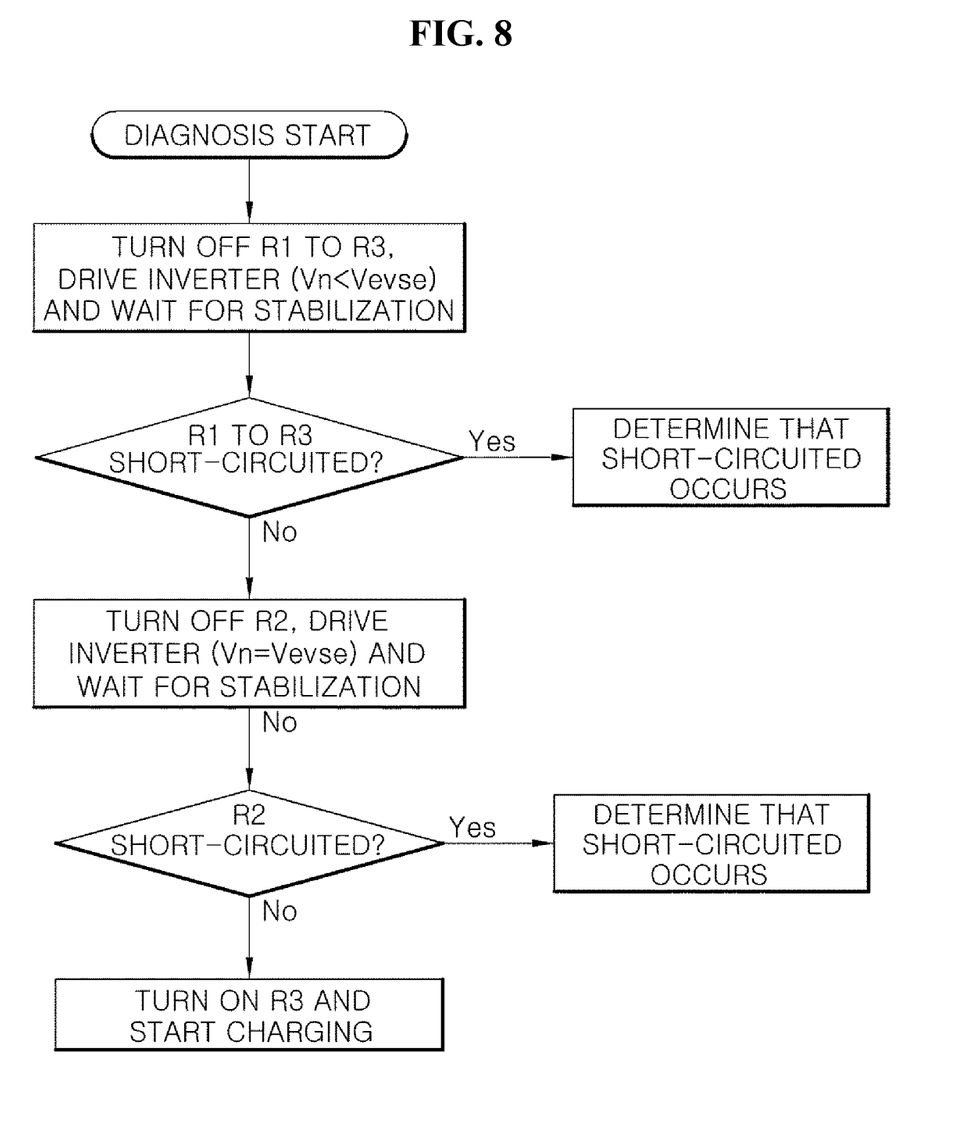
FIG. 8 is a flowchart illustrating diagnosis of short-circuit and open-circuit of a relay in a fault diagnosis apparatus of a rapid charging system for a vehicle according to another embodiment of the present disclosure.

FIG. 7 depicts a flowchart illustrating a diagnosis of short-circuit of a relay in a fault diagnosis apparatus of a rapid charging system for a vehicle according to another embodiment, and FIG. 8 is a flowchart illustrating diagnosis of short-circuit and open-circuit of a relay in a fault diagnosis apparatus of a rapid charging system for a vehicle according to another embodiment.

Referring to FIGS. 7 and 8, the fault diagnosis method of the rapid charging system for the vehicle according to the present disclosure may include controlling driving of the inverter 200 to generate the voltage Vn applied to one end of the second relay R2, and diagnosing fault of the first relay R1, the second relay R2 and the third relay R3 by comparing the voltages of both ends of the first relay R1, the second relay R2 and the third relay R3 measured in a state in which the first relay R1, the second relay R2 and the third relay R3 are turned off. Here, the voltage applied to one end of the second relay R2 may be generated by driving the inverter based on the following equation.

$$Vn=(1-Dx) \times Vbat \quad \text{Equation 2}$$

where, Vn denotes the voltage applied to one end of the second relay, Vbat denotes the voltage of the battery, and Dx denotes a ratio of a time when an upper switch between the upper and lower switches connected to each phase of the three-phase motor is turned on. More specifically, referring to FIG. 3, Dx means the ratio (0 to 1) of the time when the upper switch S1, S3 or S5 connected to the U-phase, V-phase or W-phase of the three-phase motor is turned on. In addition, in the present embodiment, the times Du, Dv and Dw when the upper switches S1, S3 and S5 connected to the phases U, V and W of the three-phase motor are turned on are preferably set to the same value, in order to prevent the three-phase motor 210 from rotating when the voltage applied to the second relay R2 is generated by setting Du, Dv and Dw to different values.

Specifically, in diagnosing of fault of the first relay R1, the second relay R2 and the third relay R3, when the predetermined time has elapsed after the voltage generated according to the above-described method is applied to the second relay R2 in a state in which the first relay R1, the second relay R2 and the third relay R3 are turned off, if the voltages of the first relay R1, the second relay R2 and the third relay R3 are the same, it may be determined that the first relay R1, the second relay R2 and the third relay R3 are short-circuited. More specifically, referring to FIG. 7, the controller 300 may determine that the first relay R1 is short-circuited if Vbat and Vnp are the same, determine that the second relay R2 is short-circuited if Vn and Vnp are the same, and determine that the third relay R3 is short-circuited if Vnp and Vevse are the same, when the predetermined time has elapsed after the voltage generated according to the above-described method is applied to the second relay R2 in a state in which the first relay R1, the second relay R2 and the third relay R3 are turned off.

Meanwhile, the fault diagnosis method of the rapid charging system for the vehicle according to the present disclosure may further include turning on the second relay R2 before the power transfer unit 200 is connected to the external device 100 and controlling driving of the inverter 200 to generate the voltage Vn applied to one end of the second relay R2, which is equal to the voltage Vevse received from the external device 100.

Further, the fault diagnosis method of the rapid charging system for the vehicle according to the present disclosure may further include turning on the second relay R2, controlling driving of the inverter 200 to generate the voltage Vn applied to one end of the second relay R2, which is equal to the voltage Vevse received from the external device 100, and determining whether the second relay R2 is open-circuited by comparing the voltages of both ends of the second relay R2, upon determining that the first relay R1, the second relay R2 and the third relay R3 are not short-circuited.

The technical features of the steps of the fault diagnosis method of the rapid charging system for the vehicle according to the present disclosure are the same as or similar to those of the components of the fault diagnosis apparatus of the rapid charging system for the vehicle.

According to the present disclosure, since fault of relays in a power transfer unit is diagnosed without additionally installing a voltage sensor, it is possible to reduce manufacturing costs. In addition, since the relays are simultaneously diagnosed, it is possible to shorten the fault diagnosis time of the relays.

Although the exemplary embodiments of the present disclosure have been disclosed for illustrative purposes, those skilled in the art will appreciate that various modifications, additions and substitutions are possible, without departing from the scope and spirit of the disclosure claimed in the accompanying claims.

The invention claimed is:

1. A fault diagnosis apparatus of a rapid charging system for a vehicle, the fault diagnosis apparatus comprising:
    an external device configured to transmit power to a vehicle battery, or to receive the power from the vehicle battery;
    a power transfer unit including a three-phase motor, an inverter connected to the battery in parallel and connected to the three-phase motor, and one or more relays connected to the three-phase motor and configured to transfer power between the external device and the battery; and
    a controller configured to control the on and off functions of the one or more relays, configured to control driving of the inverter to generate voltages applied to one end of each of the one or more relays, and configured to diagnose fault of the relays by comparing voltages of both ends of the relays while turning the one or more relays on or off,
    wherein the power transfer unit includes:
        a neutral-terminal capacitor connected to a neutral terminal of the three-phase motor in parallel;
        a second relay connected to a neutral terminal of the three-phase motor; and
        first and third relays connected to the inverter.

2. The fault diagnosis apparatus according to claim 1, wherein the controller controls on/off of the first relay, the second relay and the third relay.

3. The fault diagnosis apparatus according to claim 2, wherein the controller diagnoses the first relay, the second relay and the third relay by comparing the voltages of both ends of the first relay, the second relay and the third relay while the first relay, the second relay and the third relay are turned on/off.

4. The fault diagnosis apparatus according to claim 1, wherein the controller controls driving of the inverter to generate the voltage applied to one end of the second relay.

5. The fault diagnosis apparatus according to claim 1, wherein the voltage applied to one end of the second relay is generated by driving the inverter based on the following equation:

$$Vn=(1-Dx) \times Vbat$$

where, Vn denotes the voltage applied to one end of the second relay, Vbat denotes a voltage of the battery, and Dx denotes a ratio of a time when an upper switch between the upper and lower switches connected to each phase of the three-phase motor is turned on.

6. The fault diagnosis apparatus according to claim 1, wherein the controller generates the voltage applied to one end of the second relay, which is different from a voltage of the battery and a voltage value received from the external device.

7. The fault diagnosis apparatus according to claim 1, wherein the controller generates the voltage applied to one end of the second relay, which is less than a voltage value received from the external device.

8. The fault diagnosis apparatus according to claim 1, wherein the controller determines that the relay is short-circuited when the voltages of both ends of the relay are the same in a state in which the first relay, the second relay and the third relay are turned off.

9. The fault diagnosis apparatus according to claim 8, wherein, the controller turns on the second relay, controls driving of the inverter to generate the voltage applied to one end of the second relay, which is equal to the voltage value received from the external device, and determines whether the second relay is open-circuited by comparing the voltage of both ends of the second relay.

10. The fault diagnosis apparatus according to claim 9, wherein the controller turns on the third relay to charge the vehicle battery, upon determining that the second relay is not open-circuited.

11. The fault diagnosis apparatus according to claim 1, wherein the controller turns on the second relay before the power transfer unit is connected to the external device and controls driving of the inverter to generate the voltage applied to one end of the second relay, which is equal to the voltage value received from the external device.

12. The fault diagnosis apparatus according to claim 1, wherein the power transfer unit includes:
one or more motor relays connected to one or more of the phases of the three-phase motor;
an inductor connected to the motor relays in series; and
an inverter relay connected to the inverter.

13. The fault diagnosis apparatus according to claim 12, wherein the controller controls on/off of the motor relays, controls driving of the inverter to generate voltages applied to one end of each of the motor relays, and diagnoses fault of the motor relays by comparing voltages of both ends of the motor relays while turning the motor relays on/off.

14. The fault diagnosis apparatus according to claim 12, wherein the controller diagnoses fault of the inverter relay by comparing voltages of both ends of the inverter relay while turning the inverter relay on/off.

15. A fault diagnosis method of a rapid charging system for a vehicle using the fault diagnosis apparatus according to claim 1, the fault diagnosis method comprising:
controlling driving of the inverter to generate a voltage applied to one end of a second relay; and
diagnosing fault of a first relay, the second relay and a third relay by comparing voltages of both ends of the first relay, the second relay and the third relay measured in a state in which the first relay, the second relay and the third relay are turned off,
wherein the voltage applied to one end of the second relay is generated by driving the inverter based on the following equation: $Vn=(1-Dx) \times Vbat$ where, Vn denotes the voltage applied to one end of the second relay, Vbat denotes a voltage of the battery, and Dx denotes a ratio of a time when an upper switch between the upper and lower switches connected to each phase of the three-phase motor is turned on.

16. The fault diagnosis method according to claim 15, wherein the diagnosing of the first relay, the second relay and the third relay includes determining that the relay is short-circuited when the voltages of both ends of the relay are the same in a state in which the first relay, the second relay and the third relay are turned off.

17. The fault diagnosis method according to claim 16, further comprising turning on the second relay, controlling driving of the inverter to generate the voltage applied to one end of the second relay, which is equal to a voltage value received from the external device, and determining whether the second relay is open-circuited by comparing the voltage of both ends of the second relay.

18. The fault diagnosis method according to claim 15, further comprising turning on the second relay before the power transfer unit is connected to the external device and controlling driving of the inverter to generate the voltage applied to one end of the second relay, which is equal to a voltage value received from the external device.

* * * * *